US008610160B2

(12) United States Patent
Lee

(10) Patent No.: US 8,610,160 B2
(45) Date of Patent: Dec. 17, 2013

(54) COOLING UNIT USING IONIC WIND AND LED LIGHTING UNIT INCLUDING THE COOLING UNIT

(75) Inventor: You-seop Lee, Yongin-si (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 53 days.

(21) Appl. No.: 13/224,485

(22) Filed: Sep. 2, 2011

(65) Prior Publication Data

US 2012/0175663 A1 Jul. 12, 2012

(30) Foreign Application Priority Data

Jan. 7, 2011 (KR) ........................ 10-2011-0001798

(51) Int. Cl.
*H01L 21/00* (2006.01)

(52) U.S. Cl.
USPC ............................................................ 257/99

(58) Field of Classification Search
USPC ............................................................ 257/99
See application file for complete search history.

(56) References Cited

U.S. PATENT DOCUMENTS

| | | | |
|---|---|---|---|
| 7,190,587 B2 | 3/2007 | Kim et al. | |
| 7,214,949 B2 | 5/2007 | Schlitz | |
| 2008/0060794 A1 | 3/2008 | Wei | |
| 2008/0197779 A1 | 8/2008 | Fisher et al. | |
| 2009/0321056 A1 | 12/2009 | Ran et al. | |
| 2010/0052540 A1* | 3/2010 | Jewell-Larsen et al. | 315/111.91 |
| 2010/0116460 A1 | 5/2010 | Jewell-Larsen | |
| 2010/0177519 A1 | 7/2010 | Schlitz | |
| 2011/0058301 A1* | 3/2011 | Lim | 361/230 |
| 2011/0308775 A1* | 12/2011 | Honer | 165/120 |
| 2012/0103196 A1* | 5/2012 | Humpston | 96/63 |

FOREIGN PATENT DOCUMENTS

KR 10-0616620 8/2006

OTHER PUBLICATIONS

European Search Report dated Mar. 28, 2013 in corresponding European Patent Application 11187418.6.

* cited by examiner

*Primary Examiner* — Thao P. Le
(74) *Attorney, Agent, or Firm* — Staas & Halsey LLP

(57) ABSTRACT

A cooling unit includes a heat radiant having a heat radiating plate contacting a heating element, and a plurality of heat radiation pins protruding from the heat radiating plate and separated from each other with predetermined intervals therebetween, and formed of an electrical insulating material; and an ionic wind generating unit comprising a corona emitter electrode contacting at least one of the heat radiation pins, a collector electrode facing the corona emitter electrode, and a power unit to connect the corona emitter electrode to the collector electrode and to apply a high voltage to the corona emitter electrode. Thus, the corona emitter electrode and the collector electrode of the ionic wind generating unit may be directly attached to the heat radiant, and a small and light cooling unit may be formed.

29 Claims, 7 Drawing Sheets

COOLING UNIT USING IONIC WIND AND LED LIGHTING UNIT INCLUDING THE COOLING UNIT

CROSS-REFERENCE TO RELATED APPLICATIONS

This application claims the benefit of Korean Patent Application No. 10-2011-0001798, filed on Jan. 7, 2011, in the Korean Intellectual Property Office, the disclosure of which is incorporated herein in its entirety by reference.

BACKGROUND

1. Field

One or more aspects of an embodiment or embodiments relate to a cooling unit using ionic wind and a light emitting diode (LED) lighting unit including the cooling unit, and more particularly, to a cooling unit having an improved cooling performance by using an ionic wind generating apparatus and an LED lighting unit including the cooling unit.

2. Description of the Related Art

In general, electronic devices generate a lot of heat when operated, and the generated heat is one of reasons degrading electronic devices. Thus, a heat radiation unit is an essential element in electronic devices.

In order to cool down a heat radiation structure attached to a heating device in a conventional electronic device, natural convection or a cooling fan is used. However, according to a conventional natural convection method, it is difficult to cool down a heat radiation structure effectively, and according to a cooling fan method, noise and power consumption may increase.

Recently, cooling devices using ionic wind instead of using a cooling fan have been actively developed due to having advantages, for example, such as low noise and low power consumption. Ionic wind is generated when a high voltage is applied to an electrode, for example, such as a probe or a thin wire to generate a corona discharge and thus ionized air, and then nearby air is moved by a strong electric field.

That is, when ions are generated by a corona discharge generated by applying a high voltage to a wire or probe type emitter and are accelerated by Coulomb force due to an electric field between the emitter and a collector electrode, ionic wind flows from the emitter to a/the collector electrode, thereby transferring motion force to nearby air molecules.

A cooling operation using ionic wind does not have any element that is driven by a motor, unlike a conventional cooling fan, and thus, various advantages, for example, such as high reliability, low noise, low power consumption, and small size may be obtained. A conventional ionic wind cooling apparatus has a structure in which a plurality of metal electrodes are located around a metal heat radiation structure at predetermined intervals to generate ionic wind. When a conventional heat radiation structure is formed of a conductive material, for example, such as aluminum or copper, it is difficult to couple a conventional ionic wind cooling apparatus directly to the heat radiation structure. Also, a corona emitter electrode of a high voltage should be separated from a conductive heat radiation structure by a predetermined distance. Thus, an additional structure to support a corona emitter electrode and electrically insulating the corona emitter electrode from a heat radiation structure is necessary in a conventional ionic wind cooling apparatus. Therefore, there is a limitation in reducing a size of an ionic wind cooling apparatus that is coupled to a heat radiation structure.

SUMMARY

One or more aspects of an embodiment or embodiments provide a cooling unit in which an ionic wind generating unit is efficiently attached to a heat radiation structure so as to reduce an overall size, and a light emitting diode (LED) lighting unit including the cooling unit.

According to an aspect of an embodiment or embodiments, there is provided a cooling unit including: a heat radiant having a heat radiating plate contacting a heating element, and a plurality of heat radiation pins protruding from the heat radiating plate and separated from each other with predetermined intervals therebetween, and formed of an electrical insulating material; and an ionic wind generating unit including a corona emitter electrode contacting at least one of the heat radiation pins, a collector electrode facing the corona emitter electrode, and a power unit to connect the corona emitter electrode to the collector electrode and apply a high voltage to the corona emitter electrode.

According to another aspect of an embodiment or embodiments, there is provided a light emitting diode (LED) lighting unit including: at least one LED; a cooling unit including a plurality of heat radiation pins to radiate heat generated by the LED; and an ionic wind generating unit including a corona emitter electrode contacting at least one of the heat radiation pins, a collector electrode facing the corona emitter electrode, and a power unit to connect the corona emitter electrode to the collector electrode and apply a high voltage to the corona emitter electrode.

BRIEF DESCRIPTION OF THE DRAWINGS

The patent or application file contains at least one drawing executed in color. Copies of this patent or patent application publication with color drawing(s) will be provided by the Office upon request and payment of the necessary fee. The above and other features of an embodiment or embodiments will become more apparent by describing in detail exemplary embodiments thereof with reference to the attached drawings in which.

DETAILED DESCRIPTION

Figure 1:
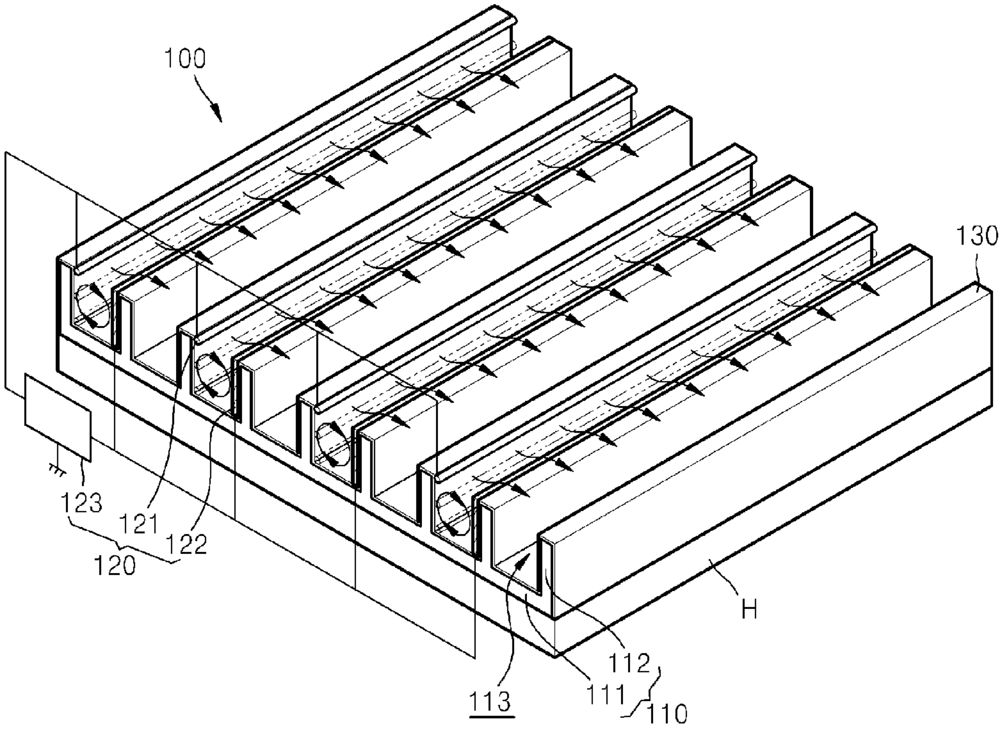
FIG. 1 is a perspective view of a cooling unit according to an embodiment.
Figure 2:
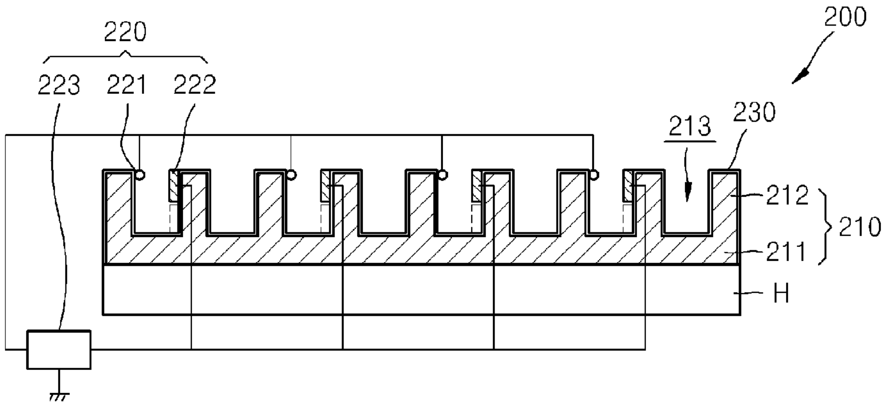
FIG. 2 is a cross-sectional view of a cooling unit according to another embodiment.
Figure 3:
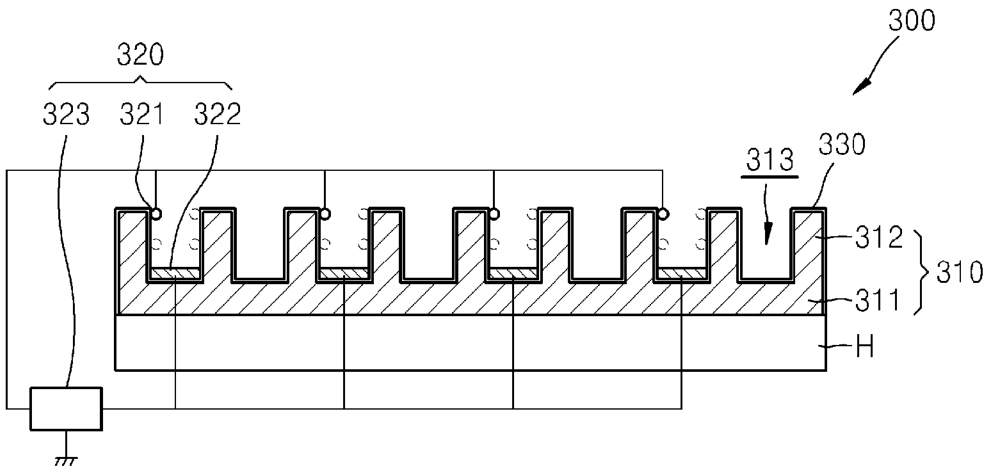
FIG. 3 is a cross-sectional view of a cooling unit according to another embodiment.

FIG. 1 is a perspective view of a cooling unit 100 according to an embodiment, FIG. 2 is a cross-sectional view of a cooling unit 200 according to another embodiment, and FIG. 3 is a cross-sectional view of a cooling unit 300 according to another embodiment.

Referring to FIG. 1, the cooling unit 100 includes a heat radiant 110 contacting a heating element H to radiate heat generated from the heating element H, and an ionic wind generating unit 120 to generate ionic wind and making the ionic wind flow on the heat radiant 110 in order to enhance the heat radiating operation of the heat radiant 110.

The heat radiant 110 includes a heat radiating plate 111 contacting the heating element H, and a plurality of heat radiation pins 112 protruding a predetermined length from the heat radiating plate 111. The plurality of heat radiation pins 112 are separated from each other by a predetermined interval along a length of the heating element H, and space portions 113 are formed between the heat radiation pins 112. The heat radiant 110 may be attached or bonded to the heating element H by using a thermal interface material (TIM) having a high thermal conductivity. Otherwise, the heat radiant 110 may be integrally formed with a material used to package the heating element H.

The heat radiant 110 may be formed of an electrical insulating material, for example, such as ceramic, or may be formed of a conductive material (e.g., copper or aluminum) and coated with ceramic. Ceramic materials have high thermal conductivities and low electrical conductivities, and when the heat radiant 110 is formed of a ceramic material, a corona emitter electrode and a collector electrode may be directly attached to the heat radiant 110.

The ionic wind generating unit 120 includes a corona emitter electrode 121 that is attached to a side surface of at least one heat radiation pin 112 along a length of the at least one heat radiation pin 112, a collector electrode 122 installed on another heat radiation pin 112 that is adjacent to the at least one heat radiation pin 112 on which the corona emitter electrode 121 is installed to face the corona emitter electrode 121, and a power unit 123 connected to the corona emitter electrode 121 and the collector electrode 122 to apply a relatively high voltage to the corona emitter electrode 121.

The corona emitter electrode 121 may be formed of a wire having a circular cross-section. The corona emitter electrode 121 may be formed of a fine cylindrical wire having a diameter of about 10 μm to about 500 μm, or may be formed by patterning an electrode having a sharp edge through an etching process and then directly attached to a side surface of one heat radiation pin 112 so as to concentrate an electric field on the side surface of the heat radiation pin 112.

The corona emitter electrode 121 may be disposed on a portion of a side surface of at least one heat radiation pin 112. In FIG. 1, the corona emitter electrode 121 is installed on an upper portion of the side surface of the at least one heat radiation pin 112; however, the corona emitter electrode 121 may be installed on an intermediate or lower portion of the side surface of the at least one heat radiation pin 112, as denoted by dotted lines. When the corona emitter electrode 121 is installed around the lower portion of the at least one heat radiation pin 112, a degree to which other electronic components are affected by electric field interference generated by the relatively high voltage applied to the corona emitter electrode 121 may be minimized, and an electric shock that may occur when a person is negligent may be prevented.

The collector electrode 122 is installed to face the corona emitter electrode 121, and may be installed to cover a side surface of at least one heat radiation pin 112 that is adjacent to another heat radiation pin 112 on which the corona emitter electrode 121 is installed.

The power unit 123 applies the relatively high voltage to the corona emitter electrode 121. When a relatively high voltage of a few kilo Volts (kV) is applied to the corona emitter electrode 121 from the power unit 123, the corona emitter electrode 121 may generate a positive corona discharge or a negative corona discharge.

Locations where the corona emitter electrode 121 and the collector electrode 122 are installed are not limited to the locations shown in FIG. 1, and may be modified variously in consideration of heat radiating efficiency. That is, the corona emitter electrode 121 and the collector electrode 122 may be installed in each of the space portions 113, or may be installed in every two or more space portions 113.

A principle of generating ionic wind in the ionic wind generating unit 120 will be described as follows.

Referring to FIG. 1, when the relatively high voltage is applied to the corona emitter electrode 121, a strong electric field is formed on the corona emitter electrode 121. If a potential gradient of the electric field exceeds a certain level, a corona discharge area is formed around the corona emitter electrode 121. Electrons in the corona discharge area are accelerated to a relatively high speed and collide with air molecules and as a result the air molecules are separated into positive ions and electrons. Through this process, a corona discharge, that is, a dense cloud of positive ions and electrons, is formed around the corona emitter electrode 121. Here, when the corona emitter electrode 121 is a cathode, the positive ions in the corona discharge area are absorbed by the corona emitter electrode 121 and the electrons are moved from the corona emitter electrode 121 toward the collector electrode 122 to generate ionic wind (denoted by an arrow). Thus, forced convection of nearby air due to the ionic wind transfers heat from the heat radiation pins 120. When the corona emitter electrode 121 is an anode, the positive ions are moved to generate the ionic wind, which is opposite to the case where the corona emitter electrode 121 is a cathode.

The negative corona discharge or the positive corona discharge generates ozone ($O_3$) as a byproduct. Since the negative corona discharge generates a greater concentration of $O_3$ than the positive corona discharge, the positive corona discharge may be preferred; however, it is not limited thereto. In order to efficiently dissolve $O_3$ generated as a byproduct by the negative or positive corona discharge, a catalyst, for example, such as a manganese (Mn) oxide, a palladium (Pd) compound, or a metal such as Pd may be used. To do this, a catalyst layer 130 made of the catalyst is formed to surround the heat radiant 110. In addition, although not shown in drawings, the catalyst may be used on other components installed around the heat radiant 110.

In addition, since $O_3$ is formed by using air, the generation of $O_3$ may be prevented in an environment where air does not exist. To do this, a device that may fill an inert gas, for example, such as nitrogen (N) or argon (Ar) into a space around the cooling unit 100 may be installed. The inert gas may prevent degradation of the electrodes.

Referring to FIG. 2, the cooling unit 200 includes a heat radiant 210 and an ionic wind generating unit 220. The heat radiant 210 including a heat radiating plate 211 and a plurality of heat radiation pins 212 is attached to a heat element H, and the ionic wind generating unit 220 includes a corona emitter electrode 221 and a collector electrode 222 installed in a space portion 213 between two adjacent heat radiation pins 212.

The corona emitter electrode 221 is installed on a side surface of at least one heat radiation pin 212, and the collector electrode 222 (denoted by a solid line) is installed to cover an upper half portion of a side surface of another heat radiation pin 212 that is adjacent to the at least one heat radiation pin 212 on which the corona emitter electrode 221 is installed to face the corona emitter electrode. The collector electrode 222 (denoted by a dotted line) may be installed to cover a lower half portion of the side surface of the another heat radiation pin 212 that is adjacent to the at least one heat radiation pin 212 on which the corona emitter electrode 221 is installed. The collector electrode 222 is not limited to an area on the side surface of the another heat radiation pin 212 as shown in FIG. 2, and the collector electrode 222 may have any of various sizes.

A power unit 223 connects the corona emitter electrode 221 and the collector electrode 222 to each other, and applies a high voltage to the corona emitter electrode 221. A catalyst layer 230 made of the catalyst is formed to surround the heat radiant 210.

Referring to FIG. 3, the cooling unit 300 includes a heat radiant 310 and an ionic wind generating unit 320. The heat radiant 310 including a heat radiating plate 311 and a plurality of heat radiation pins 312 is attached to a heating element H, and the ionic wind generating unit 320 includes a corona emitter electrode 321 and a collector electrode 322 installed in a space portion 313 between every two adjacent heat radiation pins 312.

The corona emitter electrode 321 may be attached to one of side surfaces of neighboring heat radiation pins 312 that face each other. The corona emitter electrode 321 may be attached to an upper or middle portion of the side surface of at least one heat radiation pin 312. The collector electrode 322 may be attached to the heat radiating plate 311 in the space portion 313. The corona emitter electrode 321 may be installed to be adjacent to the collector electrode 322, provided that the corona emitter electrode 321 does not contact the collector electrode 322.

A power unit 323 connects the corona emitter electrode 321 and the collector electrode 322 to each other, and applies a high voltage to the corona emitter electrode 321. A catalyst layer 330 made of the catalyst is formed to surround the heat radiant 310.

Figure 4:
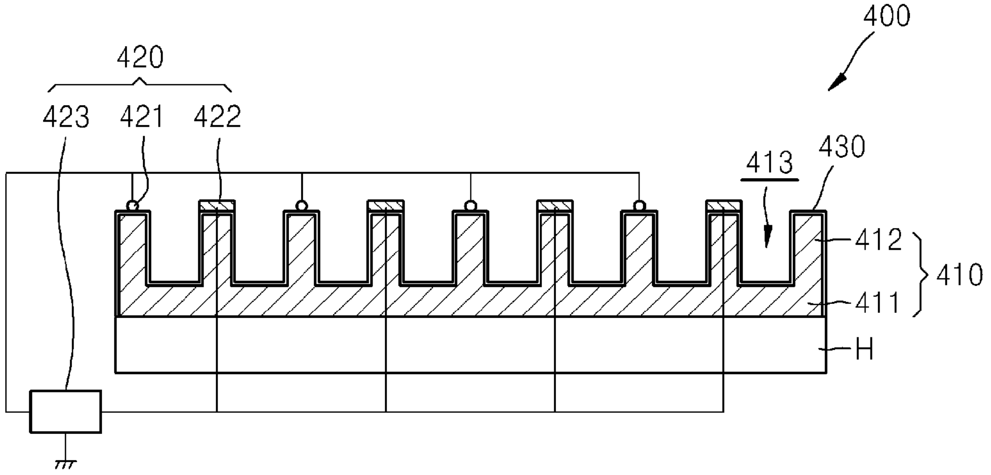
FIG. 4 is a cross-sectional view of a cooling unit according to another embodiment.

FIG. 4 is a cross-sectional view of a cooling unit 400 according to another embodiment.

Referring to FIG. 4, the cooling unit 400 includes a heat radiant 410 and an ionic wind generating unit 420. The heat radiant 410 including a heat radiating plate 411 and a plurality of heat radiation pins 412 is attached to a heating element H, and the ionic wind generating unit 420 includes a corona emitter electrode 421 attached to every other upper surface of the radiation pins 412 and a collector electrode 422 attached to the remaining upper surfaces of the heat radiation pins 412. A space portion 413 is formed between every two adjacent heat radiation pins 412.

The corona emitter electrode 421 may be attached to a random point on the upper surface of every other heat radiation pin 412, and the collector electrode 422 may be installed to cover the upper surfaces of the remaining heat radiation pins 412.

A power unit 423 connects the corona emitter electrode 421 and the collector electrode 422 to each other, and applies a high voltage to the corona emitter electrode 421. A catalyst layer 430 made of the catalyst is formed to surround the heat radiant 410.

Figure 5:
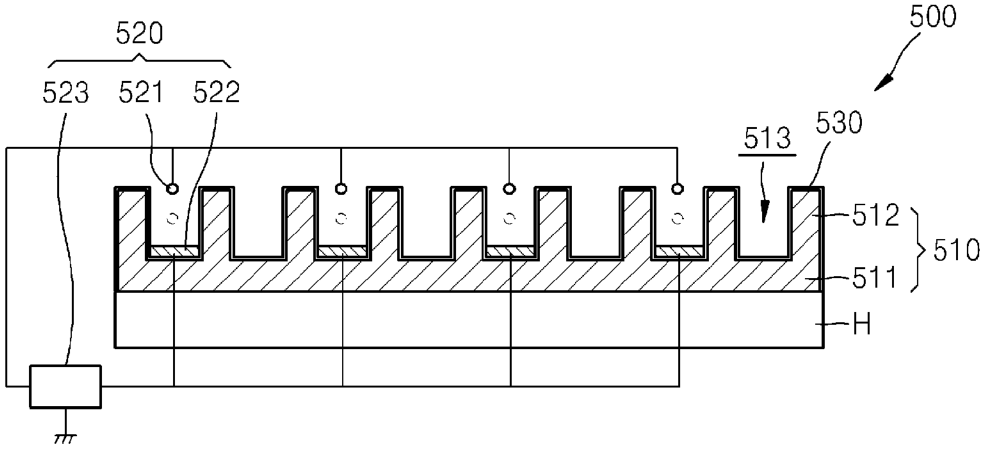
FIG. 5 is a cross-sectional view of a cooling unit according to another embodiment.
Figure 6:
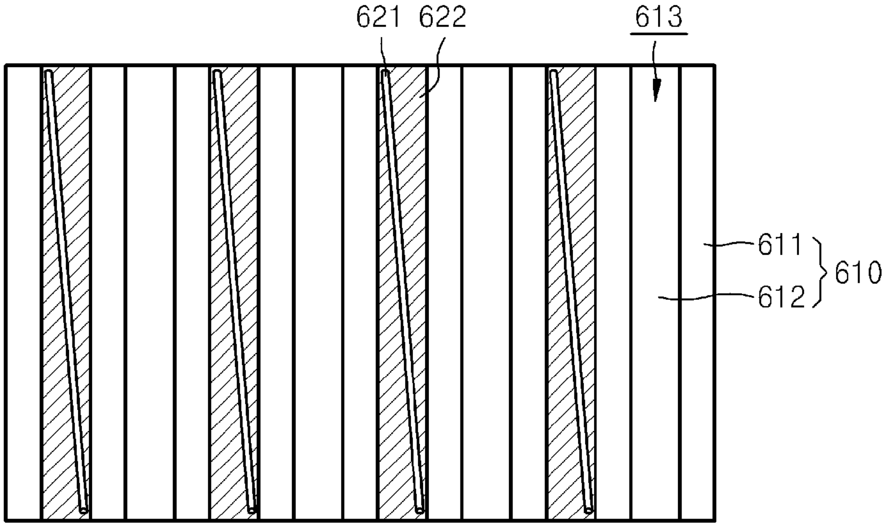
FIG. 6 is a plan view of a cooling unit according to another embodiment.

FIG. 5 is a cross-sectional view of a cooling unit 500 according to another embodiment, and FIG. 6 is a plan view of a cooling unit according to another embodiment.

Referring to FIG. 5, the cooling unit 500 includes a heat radiant 510 and an ionic wind generating unit 520. The heat radiant 510 including a heat radiating plate 511 and a plurality of heat radiation pins 512 is attached to a heating element H, and the ionic wind generating unit 520 includes a corona emitter electrode 521 and a collector electrode 522 installed in a space portion 513 formed between every two adjacent heat radiation pins 512.

The corona emitter electrode 521 may be installed on an upper portion or an intermediate portion in the space portion 513 without contacting the heat radiant 510. Since the corona emitter electrode 521 does not contact the heat radiation pins 512, the corona emitter electrode 521 may be supported by an additional supporting member (not shown) to be installed in the space portion 513. The collector electrode 522 may be attached to the heat radiating plate 511 in the space portion 513. The corona emitter electrode 521 may be installed to be adjacent to the collector electrode 522, provided that the corona emitter electrode 521 does not contact the collector electrode 522.

A power unit 523 connects the corona emitter electrode 521 and the collector electrode 522 to each other, and applies a high voltage to the corona emitter electrode 521. A catalyst layer 530 made of the catalyst is formed to surround the heat radiant 510.

Referring to FIG. 6, an entire structure shown in FIG. 6 is similar to the structure of the cooling unit 500 of FIG. 5. A heat radiant 610 includes a heat radiating plate 611 and a plurality of heat radiation pins 612. A collector electrode 622 is attached to the heat radiating plate 611 in a space portion 613 formed between two adjacent heat radiation pins 612. Although a power unit is not shown in FIG. 6, a power unit similar to the power unit 523 of FIG. 5 may be installed.

However, a corona emitter electrode 621 may be installed at a position different from that of the corona emitter electrode 521 of FIG. 5. That is, the corona emitter electrode 621 is installed in a diagonal direction of the space portion 613 so as to be slant toward the heat radiation pins 612.

Figure 7:
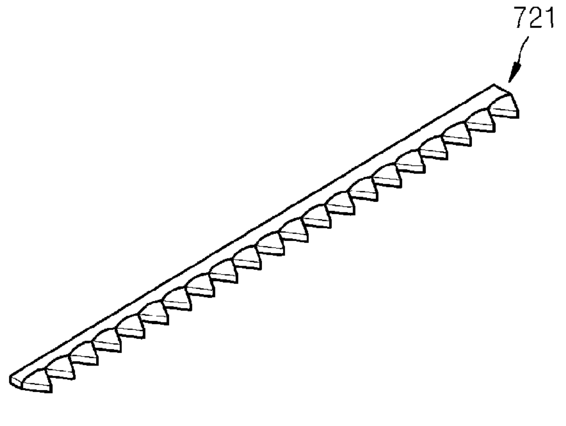
FIG. 7 is a perspective view of a corona emitter electrode according to an embodiment.
Figure 8:
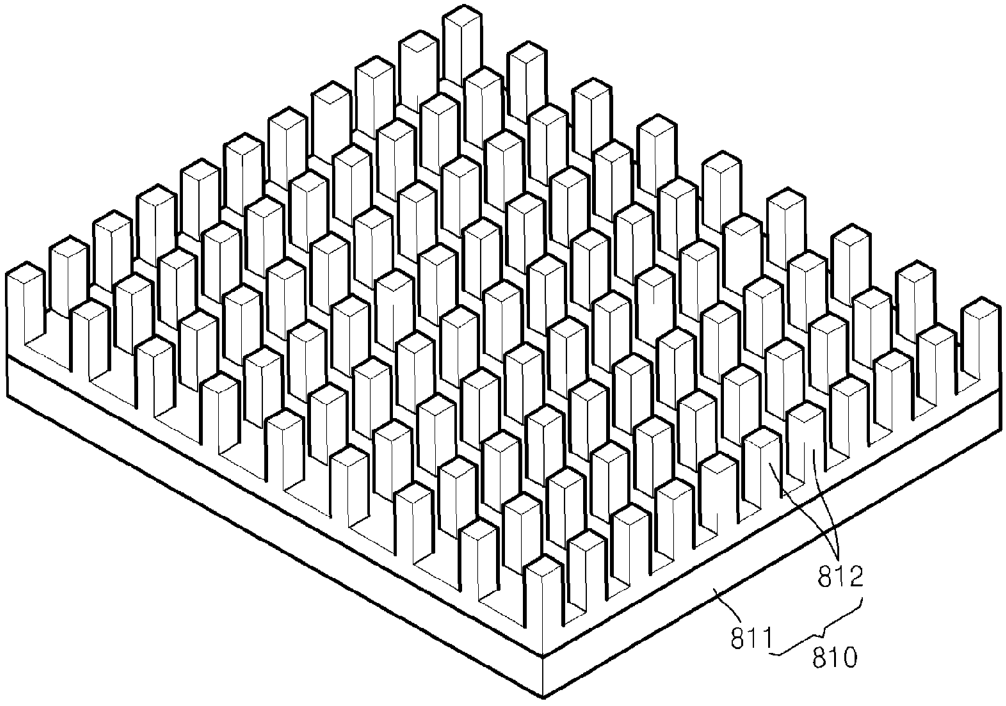
FIG. 8 is a perspective view of a cooling unit according to another embodiment.

FIG. 7 is a perspective view of a corona emitter electrode 721 according to an embodiment, and FIG. 8 is a perspective view of a heat radiant 810 according to another embodiment.

Referring to FIG. 7, the corona emitter electrode 721 is formed having a saw-tooth shape in which a plurality of unit electrodes, each formed as a conical shape, are arranged in an array. The saw-tooth shaped corona emitter electrode 721 may minimize $O_3$ generation caused by a corona discharge. This kind of corona emitter electrode 721 may be applied to the cooling units shown in FIGS. 1 through 6.

Referring to FIG. 8, the heat radiant 810 includes a heat radiating plate 811, and a plurality of unit heat radiation pins 812 attached on the heat radiating plate 811. The unit heat radiation pins 812 may be formed by dividing the heat radiation pins 112 of FIG. 1 into a plurality of pieces along a length of the heat radiation pins 112, and then, spacing the plurality of pieces a predetermined distance apart from each other. Accordingly, heat radiation performance may be improved.

Figure 9:
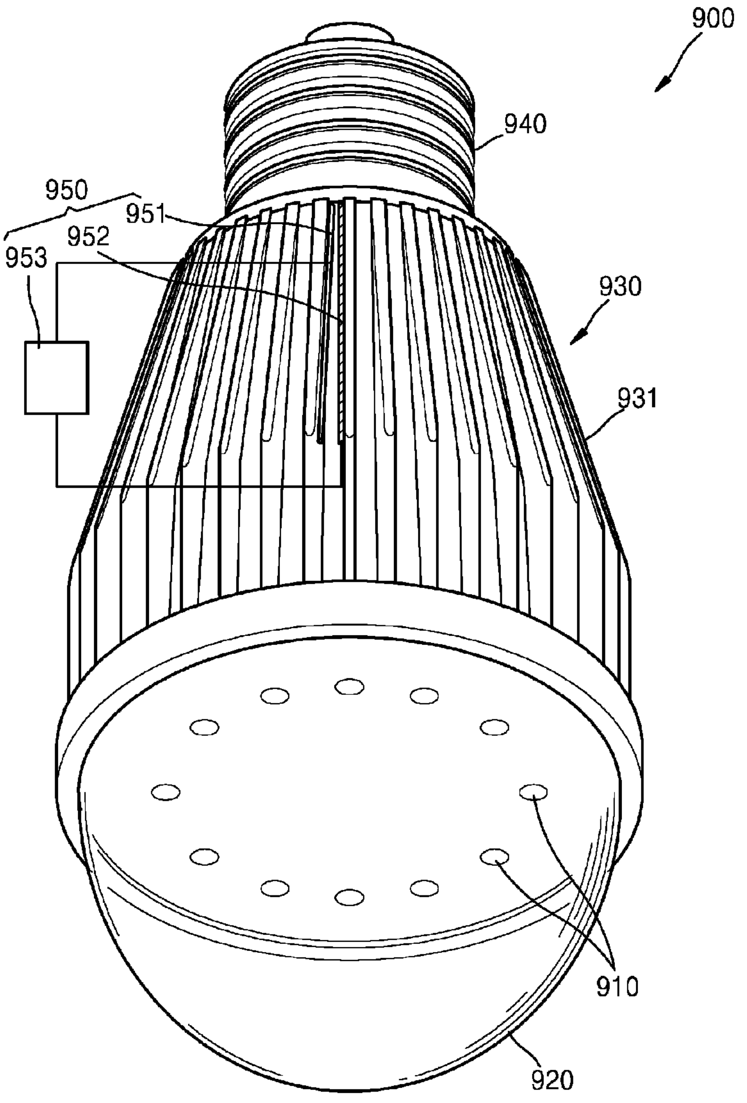
FIG. 9 is a perspective view of a light emitting diode (LED) lighting unit including an ionic wind cooling device according to an embodiment.

FIG. 9 is a light emitting diode (LED) lighting unit 900 including an ionic wind generating unit according to the embodiment.

Referring to FIG. 9, any of the ionic wind generating units according to the embodiments shown in FIGS. 1 through 6 may be applied to a cooling unit of the LED lighting unit 900. In FIG. 9, the LED lighting unit 900 includes the ionic wind generating unit shown in FIG. 1.

The LED lighting unit 900 includes a plurality of LEDs 910 to emit light, a transparent cover 920 surrounding the LEDs 910 to protect the LEDs 910, a cooling portion 930 including a plurality of heat radiation pins 931 so as to radiate heat generated by the LEDs 910, and a socket 940 to connect to an electric power.

A ionic wind generating unit 950 includes corona emitter electrodes 951 attached to side surfaces of the heat radiation pins 931, collector electrodes 952 attached to side surfaces of the heat radiation pins 931 facing the side surfaces on which the corona emitter electrodes 951 are attached, and a power unit 953 to connect the corona emitter electrodes 951 to the collector electrodes 952 and to apply a high voltage to the corona emitter electrodes 951.

Principles of generating ionic wind in the ionic wind generating unit 950 are described in the above embodiments, and detailed descriptions thereof are not provided here.

Figure 10:
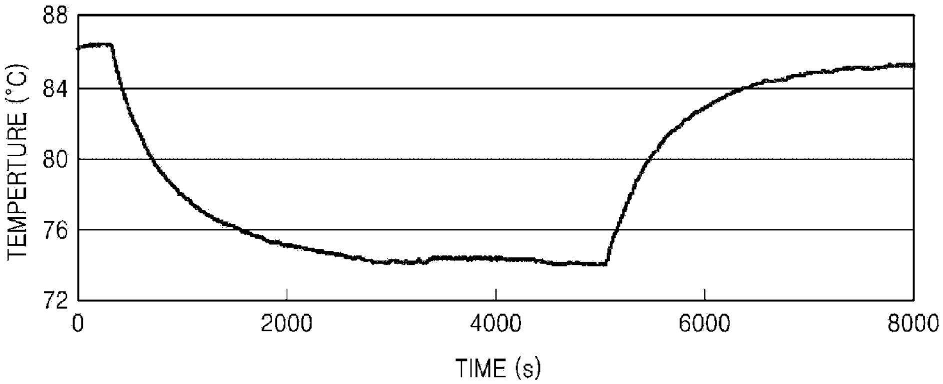
FIG. 10 is a graph illustrating performance of a cooling unit according to an embodiment.
Figure 11:
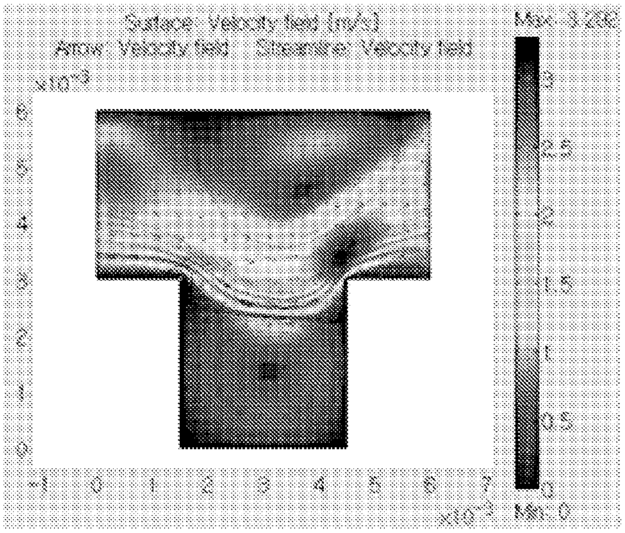
FIG. 11 is a graph showing results of measuring velocity variation of ionic wind by a cooling unit according to an embodiment.
Figure 12:
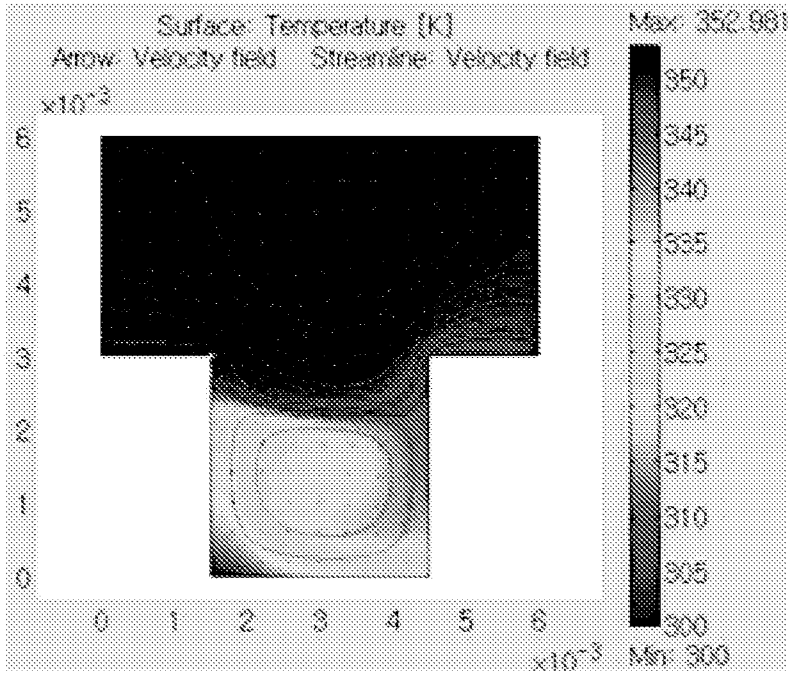
FIG. 12 is a graph showing results of measuring temperature variation of a heating element when a cooling unit according to an embodiment operates.

FIG. 10 is a graph illustrating performance of a cooling unit according to an embodiment, FIG. 11 is a graph showing results of measuring velocity variation of ionic wind in a cooling unit according to an embodiment, and FIG. 12 is a graph illustrating results of measuring temperature variation of a heat radiant when a cooling unit according to an embodiment operates.

Referring to FIG. 10, using the cooling unit shown in FIG. 5, a tungsten wire having a diameter of 25 μm is installed at an upper location 2.52 mm apart from the collector electrode attached to the heat radiating plate, and a voltage of about 3.5 kV to about 4 kV is applied between the electrodes to generate ionic wind to cool down the heat radiating plate formed of a ceramic material.

A temperature of the heat radiating plate is cooled down to 74° C. when the ionic wind is generated, while the highest temperature of the heat radiating plate is 86° C. when the ionic wind is not generated. Thus, the cooling operation may be performed more efficiently when the ionic wind is generated.

FIG. 11 shows a velocity field of ionic wind, that is, a flow analysis result showing a cooling effect on a heat radiant coupled to an ionic wind generating unit.

It is assumed that air at a predetermined temperature, for example, 300K, is induced under a condition where a heating element is located under a heat radiant and a lower portion of a heat radiation pin is heated constantly. When a corona emitter electrode of an ionic wind generating unit is located on an upper portion of the heat radiation pin, ionic wind having a velocity of about 1 to 3 m/s is generated even in a small space having a width of about 3 mm.

When the ionic wind generating unit is located on the heat radiation pin array in the heat radiant, hot air does not stay around the heat radiation pin, but is moved in a predetermined direction by an air flow induced by the ionic wind. This becomes an advantage in efficiently cooling down the heating element in a small space.

FIG. 12 shows a temperature distribution cooled down by generation of ionic wind. That is, a heat radiating plate of a cooling unit located on a hot heating element may be efficiently cooled down by the ionic wind. The cooling unit using the ionic wind may efficiently cool down the heating element without generating much noise even in a small space, where it is difficult to use a conventional cooling fan. A heat radiating structure, for example, such as a ceramic heat radiant having an excellent thermal conductivity and low electrical conductivity may be used instead of a conventional metal heat radiant, or a heat radiant formed by coating ceramic onto a conventional metal heat radiating structure may be used in order to directly form a corona emitter electrode and a collector electrode used to generate the ionic wind on a heat radiant.

While this invention has been particularly shown and described with reference to exemplary embodiments thereof, it will be understood by those of ordinary skill in the art that various changes in form and details may be made therein without departing from the spirit and scope of the invention as defined by the appended claims.

The invention claimed is:

1. A cooling unit comprising:

a heat radiant comprising a heat radiating plate contacting a heating element, and a plurality of heat radiation pins protruding from the heat radiating plate and separated from each other with predetermined intervals therebetween, and the heat radiant is formed of an electrical insulating material; and an ionic wind generating unit comprising a corona emitter electrode and a collector electrode contacting at least one of the heat radiation pins and separated from each other, and a power unit to connect the corona emitter electrode to the collector electrode and apply a high voltage to the corona emitter electrode.

2. The cooling unit of claim 1, wherein the corona emitter electrode is attached to a side surface of one of two adjacent heat radiation pins, and the collector electrode is attached to a side surface of the other heat radiation pin to face the corona emitter electrode.

3. The cooling unit of claim 2, wherein the collector electrode is attached to an upper portion or a lower portion of at least one heat radiation pin.

4. The cooling unit of claim 2, wherein the collector electrode is installed to contact the heat radiating plate between two adjacent heat radiation pins.

5. The cooling unit of claim 1, wherein the corona emitter electrode is attached to an upper surface on one of two adjacent heat radiation pins, and the collector electrode is attached to an upper surface of the other heat radiation pin.

6. The cooling unit of claim 1, wherein the corona emitter electrode is formed of a wire having a circular cross-section.

7. The cooling unit of claim 1, wherein the corona emitter electrode is formed having a saw-tooth shape.

8. The cooling unit of claim 1, wherein each of the heat radiation pins is divided into a plurality of unit radiation pins in a length direction of the heat radiation pins.

9. The cooling unit of claim 1, wherein the heat radiant is coated with a catalyst that dissolves ozone ($O_3$) generated as a byproduct when the ionic wind generating unit operates.

10. The cooling unit of claim 1, wherein the heat radiant is formed of a ceramic material.

11. The cooling unit of claim 1, wherein the heat radiant is formed by coating an electrical insulating material on a conductive material.

12. A cooling unit comprising:

a heat radiant comprising a heat radiating plate contacting a heating element, and a plurality of heat radiation pins protruding from the heat radiating plate and separated from each other with predetermined intervals therebetween, and the heat radiant is formed of an electrical insulating material; and an ionic wind generating unit comprising a corona emitter electrode disposed at a point along a protruding direction of the heat radiation pin in a predetermined space formed between adjacent heat radiation pins, a collector electrode facing the corona emitter electrode, and a power unit to connect the corona emitter electrode to the collector electrode and apply a high voltage to the corona emitter electrode.

13. The cooling unit of claim 12, wherein the collector electrode is installed to contact the heat radiating plate between two adjacent heat radiation pins.

14. The cooling unit of claim 13, wherein the corona emitter electrode is disposed diagonally along a length direction of the heat radiation pins in the predetermined space.

15. The cooling unit of claim 12, wherein the corona emitter electrode is formed of a wire having a circular cross-section.

16. The cooling unit of claim 12, wherein the corona emitter electrode is formed having a saw-tooth shape.

17. The cooling unit of claim 12, wherein each of the heat radiation pins is divided into a plurality of unit radiation pins in a length direction of the heat radiation pins.

18. The cooling unit of claim 12, wherein the heat radiant is coated with a catalyst that dissolves $O_3$ generated as a byproduct when the ionic wind generating unit operates.

19. The cooling unit of claim 12, wherein the heat radiant is formed of a ceramic material.

20. The cooling unit of claim 12, wherein the heat radiant is formed by coating an electrical insulating material on a conductive material.

21. A light emitting diode (LED) lighting unit comprising:

at least one LED;

a cooling unit comprising a plurality of heat radiation pins to radiate heat generated by the LED; and an ionic wind generating unit comprising a corona emitter electrode and a collector electrode contacting at least one of the heat radiation pins and separated from each other, and a power unit to connect the corona emitter electrode to the collector electrode and apply a high voltage to the corona emitter electrode.

22. The LED lighting unit of claim 21, wherein the corona emitter electrode is attached to a side surface of one of two adjacent heat radiation pins, and the collector electrode is attached to a side surface of the other heat radiation pin.

23. The cooling unit of claim 9, wherein the catalyst is manganese (Mn) oxide, palladium (Pd) or Pd compound, wherein a catalyst layer made of the catalyst is formed to surround the heat radiant.

24. The cooling unit of claim 18, wherein the catalyst is Mn oxide, Pd or Pd compound, wherein a catalyst layer made of the catalyst is formed to surround the heat radiant.

25. The cooling unit of claim 1, wherein an inert gas is provided into a space around the cooling unit to prevent the generation of $O_3$.

26. The cooling unit of claim 12, wherein the corona emitter electrode does not contact the heat radiant and the collector electrode.

27. The cooling unit of claim 14, wherein the corona emitter electrode does not contact the heat radiant and the collector electrode.

28. The cooling unit of claim 1, wherein the corona emitter electrode is installed on the lower portion of the side surface of the at least one of plurality of heat radiation pins.

29. The cooling unit of claim 1, wherein the corona emitter electrode does not contact the collector electrode.

* * * * *